United States Patent [19]

Dorri et al.

[11] Patent Number: 6,100,780
[45] Date of Patent: Aug. 8, 2000

[54] CRYOGENIC-FLUID-COOLED OPEN MRI MAGNET WITH UNIFORM MAGNETIC FIELD

[75] Inventors: Bizhan Dorri, Clifton Park; Evangelos Trifon Laskaris, Schenectady; Michele Dollar Ogle, Burnt Hills, all of N.Y.; Timothy John Havens, Florence, S.C.

[73] Assignee: General Electric Company, Schenectady, N.Y.

[21] Appl. No.: 08/801,136

[22] Filed: Mar. 10, 1997

Related U.S. Application Data

[63] Continuation of application No. 08/547,085, Oct. 23, 1995, abandoned.

[51] Int. Cl.$^7$ .................................................. H01F 1/00
[52] U.S. Cl. ................................. 335/216; 335/299
[58] Field of Search .......................... 335/216, 296–299; 324/318–321; 505/892

[56] References Cited

U.S. PATENT DOCUMENTS

| | | | |
|---|---|---|---|
| 4,698,611 | 10/1987 | Vermilyea | 335/298 |
| 4,710,741 | 12/1987 | McGinley | 335/296 |
| 4,924,198 | 5/1990 | Laskaris | 335/216 |
| 5,001,447 | 3/1991 | Jayakumar | 335/299 |
| 5,291,169 | 3/1994 | Ige et al. | 335/216 |
| 5,343,183 | 8/1994 | Shimada et al. | 335/301 |
| 5,389,909 | 2/1995 | Havens | 335/216 |
| 5,410,287 | 4/1995 | Laskaris et al. | 335/299 |
| 5,436,364 | 10/1995 | Mueller | 335/299 |
| 5,463,364 | 10/1995 | Müller | 335/299 |
| 5,485,088 | 1/1996 | Westphal et al. | 324/320 |

FOREIGN PATENT DOCUMENTS

| | | |
|---|---|---|
| 0216404 | 4/1987 | European Pat. Off. . |
| 4416907 | 9/1995 | Germany . |
| 4412755 | 10/1995 | Germany . |
| 2219406 | 12/1989 | United Kingdom . |
| 2262611 | 6/1993 | United Kingdom . |

OTHER PUBLICATIONS

Pending U.S. Patent Application Serial No. 373,995, Filed Oct. 17, 1995, by B. Dorri, "Method for Passively Shimming an Open Magnet".
Pending U.S. Patent Application Serial No. 373,996, Filed Oct. 17, 1995, by B. Dorri, "Method for Passively Shimming A Magnet".
Concurrently filed U.S. Patent Application RD–24503, by Bizhan Dorri et al., entitled "Shielded and Open MRI Magnet", Serial No. 08/547083.
Concurrently filed U.S. Patent Application RD–24648, by Bizhan Dorri et al., entitled "Open MRI Magnet with Homogeneous Imaging Volume", Serial No. 08/547002.
Pending U.S. Patent Application Serial No. 08/509,565, Filed Jul. 31, 1995, by T. Havens et al., "Open Architecture Magnetic Resonance Imaging Superconducting Magnet Assembly".
Concurrently filed U.S. Patent Application RD–24684, by E.T. Laskaris, et al., entitled"Open MRI Superconductiave Magnet With Cryogenic–Fluid Cooling", Serial No. 08/553738.

Primary Examiner—Lincoln Donovan
Attorney, Agent, or Firm—Douglas E. Erickson; Marvin Snyder

[57] ABSTRACT

An open magnetic resonance imaging (MRI) magnet having first and second spaced-apart superconductive coil assemblies each including a toroidal-shaped coil housing containing a superconductive main coil at least partially immersed in a cryogenic fluid such as liquid helium. A generally-non-permanently-magnetized ferromagnetic ring is associated with each coil assembly, being generally coaxially aligned with the associated coil assembly and being spaced radially inward and radially apart from the associated coil assembly's superconductive main coil. The ferromagnetic rings overcome the gross magnetic field distortions in the imaging volume of the superconductive main coils (created by the open space between the magnet's superconductive coil assemblies) to produce a magnetic field of high uniformity within the imaging volume.

9 Claims, 3 Drawing Sheets

CRYOGENIC-FLUID-COOLED OPEN MRI MAGNET WITH UNIFORM MAGNETIC FIELD

RELATED APPLICATIONS

This application is a continuation of Ser. No. 08/547,085 filed Oct. 23, 1995, now abandoned.

BACKGROUND OF THE INVENTION

The present invention relates generally to a cryogenic-fluid-cooled (e.g., a liquid-helium-cooled) superconductive magnet used to generate a high magnetic field as part of a magnetic resonance imaging (MRI) system, and more particularly to such a magnet having an open design and a magnetic field of high uniformity.

MRI systems employing superconductive or other type magnets are used in various fields such as medical diagnostics. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a helium dewar which is surrounded by a dual thermal shield which is surrounded by a vacuum enclosure. Nb—Ti superconductive coils typically operate at a temperature of generally 4 Kelvin, and Nb—Sn superconductive coils typically operate at a temperature of generally 10 Kelvin.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. Although the magnet is so designed to have a highly uniform magnetic field within the imaging volume, manufacturing tolerances in the magnet and magnetic field disturbances caused by the environment at the field site of the magnet usually require that the magnet be corrected at the field site for such minor irregularities in the magnetic field. Typically, the magnet is shimmed at the field site by using pieces of iron, or, for Nb—Ti superconductive magnets cooled by liquid helium, by using numerous Nb—Ti superconductive correction coils. The correction coils are placed within the superconductive coil assembly radially near and radially inward of the main coils. Each correction coil carries a different, but low, electric current in any required direction including a direction opposite to the direction of the electric current carried in the main coils.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. The literature is largely silent on how superconductive open magnets can be made to have a magnetic field of high uniformity within the imaging volume when the creation of the open space between the superconductive coil assemblies grossly distorts the magnetic field creating a magnetic field of low uniformity within the imaging volume. Such magnetic field distortion is well beyond that which can be overcome by using known magnet shimming technology.

What is needed is a cryogenic-fluid-cooled open MRI magnet designed to have a highly uniform magnetic field within its imaging volume despite the gross magnetic field distortions created by the open space between the magnet's superconductive coil assemblies.

SUMMARY OF THE INVENTION

It is an object of the invention to provide a cryogenic-fluid-cooled open superconductive MRI magnet designed to have a magnetic field of high uniformity within its imaging volume.

The open MRI magnet of the invention includes a first superconductive coil assembly including a generally toroidal-shaped first coil housing and a generally annular-shaped first superconductive main coil. The first coil housing surrounds a first bore and has a generally longitudinal first axis. The first main coil is generally coaxially aligned with the first axis, disposed within the first coil housing, and at least partially immersed in a cryogenic fluid. The open MRI magnet also includes a generally-non-permanently-magnetized first ferromagnetic ring generally coaxially aligned with the first axis and spaced radially inward and radially apart from the first superconductive main coil. The open MRI magnet additionally includes a second superconductive coil assembly including a generally toroidal-shaped second coil housing and a generally annular-shaped second superconductive main coil. The second coil housing is longitudinally spaced apart from the first coil housing, surrounds a second bore, and has a generally longitudinal second axis which is generally coaxially aligned with the first axis. The second main coil is generally coaxially aligned with the second axis, disposed within the second coil housing, and at least partially immersed in a cryogenic fluid. The open MRI magnet further includes a generally-non-permanently-magnetized second ferromagnetic ring generally coaxially aligned with the second axis and spaced radially inward and radially apart from the second superconductive main coil. In a preferred embodiment, the second superconductive coil assembly is a generally mirror image of the first superconductive coil assembly, and the second ferromagnetic ring is a generally mirror image of the first ferromagnetic ring.

Several benefits and advantages are derived from the invention. With Applicant's open MRI magnet design, the ferromagnetic rings may be chosen by magnetic field analysis to overcome the gross magnetic field distortions within the imaging volume of the main coils (created by the open space between the magnet's superconductive coil assemblies) to produce a magnetic field of high uniformity within the imaging volume. Applicant's highly uniform magnetic field permits high quality MRI imaging. Applicant's open magnet design overcomes any claustrophobia feelings of patients. Applicant's design of an open magnet with a highly uniform magnetic field gives access to the patient by medical personnel for surgery or other medical procedures during high-quality MRI imaging.

BRIEF DESCRIPTION OF THE DRAWINGS

The accompanying drawings illustrate two preferred embodiments of the present invention wherein.

DETAILED DESCRIPTION OF THE INVENTION

Figure 1:
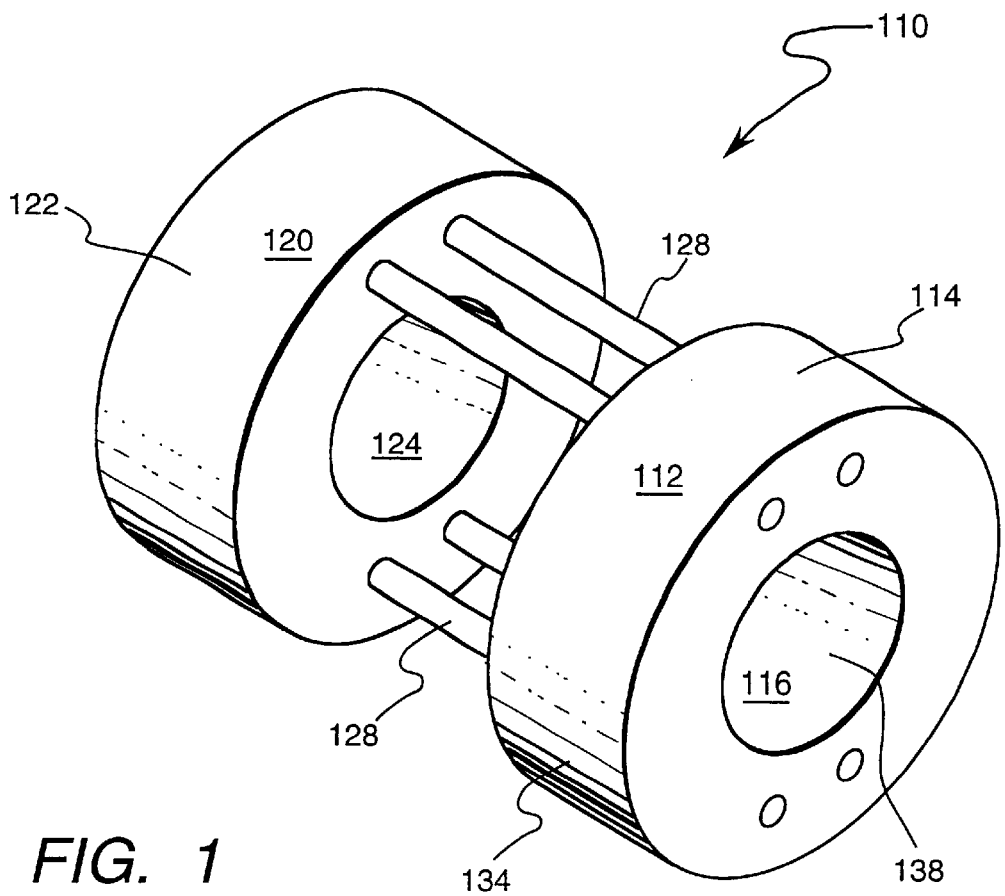
FIG. 1 is a perspective view of a first preferred embodiment of the open MRI magnet of the invention having internal ferromagnetic rings.
Figure 2:
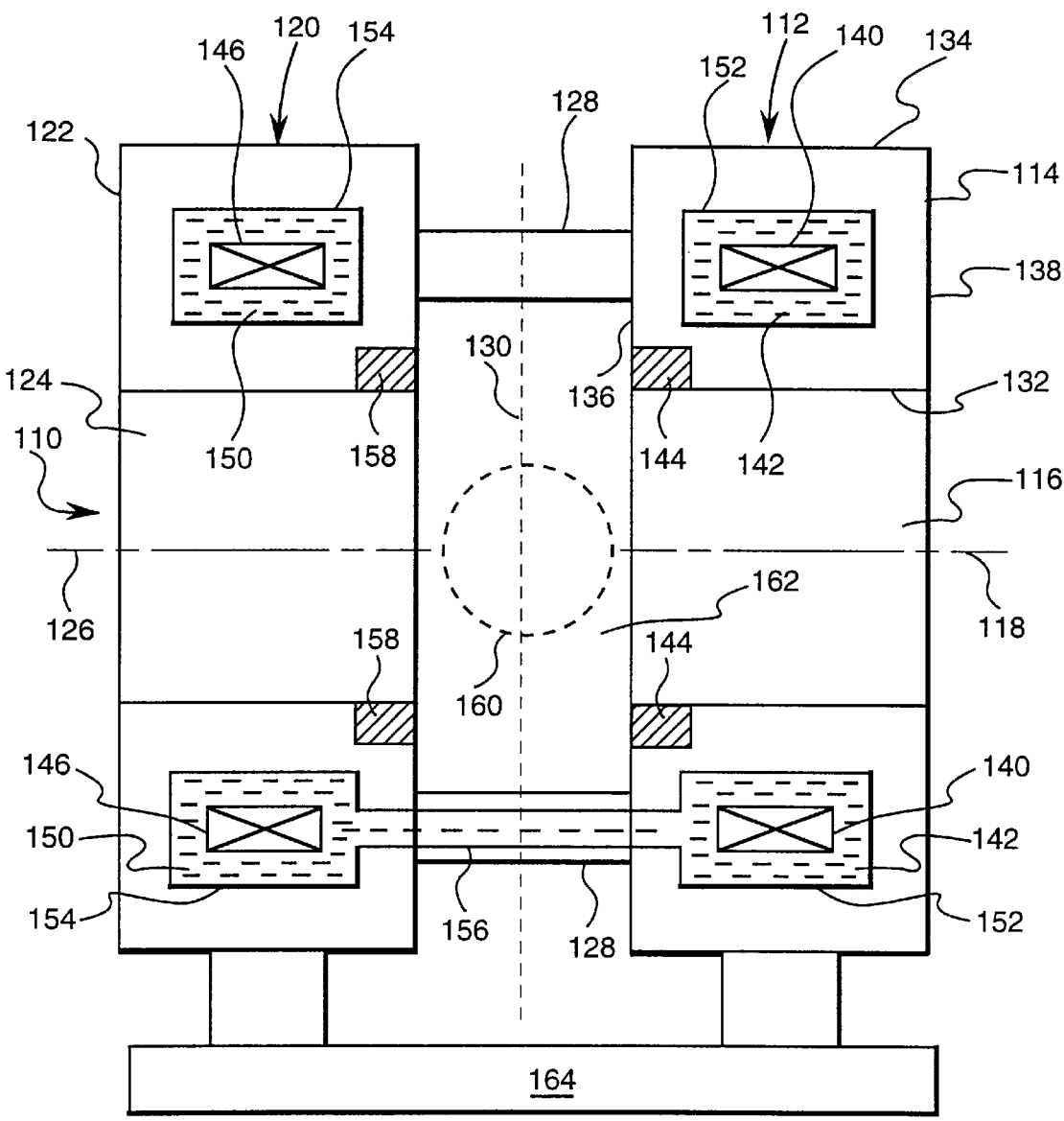
FIG. 2 is a schematic cross-sectional side-elevational view of the MRI magnet of FIG. 1 with a magnet floor mount added.

Referring now to the drawings, wherein like numerals represent like elements throughout, FIGS. 1–2 show a first preferred embodiment of the open magnetic resonance imaging (MRI) magnet 110 of the present invention. The magnet 110 includes a first superconductive coil assembly 112 with a generally toroidal-shaped first coil housing 114 which surrounds a first bore 116 and which has a generally longitudinal first axis 118. The magnet 110 also includes a second superconductive coil assembly 120 with a generally toroidal-shaped second coil housing 122 which surrounds a second bore 124 and which has a generally longitudinal second axis 126. The second coil housing 122 is longitudinally spaced apart from the first coil housing 114 by structural posts 128, and the second axis 126 is generally coaxially aligned with (i.e., generally coincident with) the first axis 118. Preferably, the second superconductive coil assembly 120 is a generally mirror image of the first superconductive coil assembly 112 about a plane 130 (seen on edge as a dashed line in FIG. 2) oriented perpendicular to the first axis 118 and disposed longitudinally midway between the first and second coil housings 114 and 122.

The first coil housing 114 includes a first generally-circumferential outside surface 132 facing generally towards the first axis 118 and a second generally-circumferential outside surface 134 radially spaced apart from the first circumferential outside surface 132 and facing generally away from the first axis 118. The first coil housing 114 also includes a first generally-annular outside surface 136 facing generally towards the plane 130 and a second generally-annular outside surface 138 longitudinally spaced apart from the first annular outside surface 136 and facing generally away from the plane 130.

The first superconductive coil assembly 112 also includes a generally annular-shaped first superconductive main coil 140 and preferably includes generally annular-shaped additional superconductive main coils (not shown in the figures). The additional superconductive main coils may be needed to achieve a high magnetic field strength, within the magnet's imaging volume, without exceeding the critical current density of the superconductor being used in the coils, as is known to those skilled in the art. The first superconductive main coil 140 is conventionally supported on a coil form (not shown in the figures). The first superconductive main coil 140 is generally coaxially aligned with the first axis 118, is disposed within the first coil housing 114, is at least partially immersed in a cryogenic fluid 142, and carries a first main electric current in a first direction. The first direction is defined to be either a clockwise or a counter-clockwise circumferential direction about the first axis 118 with any slight longitudinal component of current direction being ignored. The first superconductive main coil 140 typically would be a superconductive wire or superconductive tape wound such that the first superconductive main coil 140 has a longitudinal extension and a radial extension (i.e., radial thickness) far greater than the corresponding dimensions of the superconductive wire or superconductive tape.

The magnet 110 additionally includes a generally-non-permanently-magnetized first ferromagnetic ring 144 generally coaxially aligned with the first axis 118 and spaced radially inward and radially apart from the first superconductive main coil 140. The first ferromagnetic ring 144 may be a circumferentially-continuous ring, an array of circumferentially-abutting ring segments, or an array of spaced-apart, circumferentially-adjacent ring segments wherein the length of the arc of any circumferential space between circumferentially-adjacent ring segments is always smaller than the arc length of any ring segment making up the array. In the first preferred embodiment, as shown in FIG. 2, the first ferromagnetic ring 144 is disposed within the first coil housing 114 proximate the first circumferential outside surface 132 and proximate the first annular outside surface 136. In an exemplary construction, the first ferromagnetic ring 144 consists essentially of (and preferably consists of) carbon steel.

As previously mentioned and as shown in FIGS. 1 and 2, the second superconductive coil assembly 120 is a generally mirror image of the first superconductive coil assembly 112 about the plane 130. Therefore, in addition to the second coil housing 122, the second superconductive coil assembly 120 also includes a generally annular-shaped second superconductive main coil 146 and preferably includes generally annular-shaped additional superconductive main coils. It is noted that the additional superconductive main coils would be needed by the second superconductive coil assembly 120 to balance any extra additional superconductive main coils of the first superconductive coil assembly 112, as can be appreciated by those skilled in the art. The second superconductive main coil 146 is conventionally supported on a coil form (not shown in the figures).

The second superconductive main coil 146 is generally coaxially aligned with the second axis 126, is disposed within the second coil housing 122, carries a second main electric current in the first direction (i.e., in the same direction as the electric current in the first superconductive main coil 140), and is at least partially immersed in a cryogenic fluid 150. In the first preferred embodiment, as seen in FIG. 2, the cryogenic fluid 150 containing the second superconductive main coil 146 is in fluid communication with the cryogenic fluid 142 containing the first superconductive main coil 140. In an exemplary enablement, the cryogenic fluid 142 containing the first superconductive main coil 140 and the cryogenic fluid 150 containing the second superconductive main coil 146 each consist essentially of (and preferably consist of) liquid helium.

In a preferred construction, a first dewar 152 contains the cryogenic fluid 142 and is spaced-apart from and surrounds the first superconductive main coil 140, and a second dewar 154 contains the cryogenic fluid 150 and is spaced-apart from and surrounds the second superconductive main coil 146. A dewar conduit 156 fluidly interconnects the first and second dewars 152 and 154. Preferably, one of the bottom structural posts 128 is hollow with the dewar conduit 156 located therein. Typically, the two coil housings 114 and 122 and the hollow bottom structural post 128 together form a vacuum enclosure. A dual thermal shield (omitted from the figures for clarity) is spaced-apart from and surrounds each dewar 152 and 154 with the dual thermal shield itself being spaced apart from and surrounded by the corresponding coil housing 114 and 122. Conventional thermally-insulative spacers (not shown) separate spaced-apart elements, as is known to the artisan.

The magnet 110 further includes a generally-non-permanently-magnetized second ferromagnetic ring 158 generally coaxially aligned with the second axis 126 and spaced radially inward and radially apart from the second superconductive main coil 146. The second ferromagnetic ring 158 may be a circumferentially-continuous ring, an array of circumferentially-abutting ring segments, or an array of spaced-apart, circumferentially-adjacent ring segments wherein the length of the arc of any circumferential space between circumferentially-adjacent ring segments is always smaller than the arc length of any ring segment making up the array. In the first preferred embodiment, as shown in FIG. 2, the second ferromagnetic ring 158 is disposed within the second coil housing 122 proximate the circumferential outside surface which faces radially inward toward the second axis 126 and proximate the annular outside surface which faces longitudinally inward toward the plane 130. In an exemplary construction, the second ferromagnetic ring 158 consists essentially of (and preferably consists of) carbon steel. Preferably, the second ferromagnetic ring 158 is a generally mirror image of the first ferromagnetic ring 144 about the plane 130.

The superconductive main coils 140 and 146 of the magnet 110 typically produce a generally spherical imaging volume 160 (shown as a dotted circle in FIG. 2) centered generally at the intersection of the plane 130 and the first axis 118. The effect of the open space 162 between the two superconductive coil assemblies 112 and 120 is to distort the uniformity of the magnetic field of the spherical imaging volume 160. As one moves longitudinally through the spherical imaging volume 160, the magnitude of the magnetic field decreases with decreasing distance from the center of the spherical imaging volume 160 because of the missing superconductive main coils which were removed to create the open space 162. The effect of the ferromagnetic rings 144 and 158 is to lower the magnitude of the magnetic field toward the longitudinal edges of the spherical imaging volume 160 in line with the lower magnitude at the center. The ferromagnetic rings 144 and 158 are designed, using the principles of the present invention, previously disclosed herein, together with conventional magnetic field analysis, as is within the skill of the artisan, to produce a highly homogeneous magnetic field within the spherical imaging volume 160 for improved MRI imaging. It is noted that the magnet 110 is supported on a conventional magnet floor mount 164.

Figure 4:
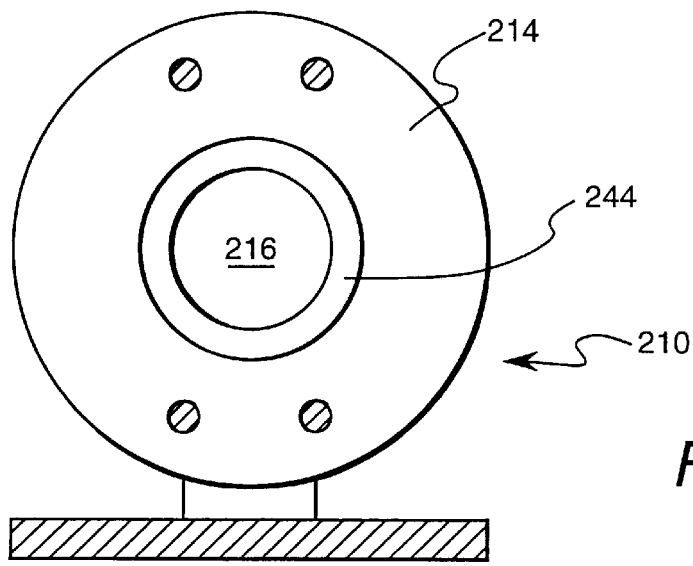
FIG. 4 is a schematic cross-sectional view of the MRI magnet of FIG. 3 taken along the lines 4—4 of FIG. 3.
Figure 3:
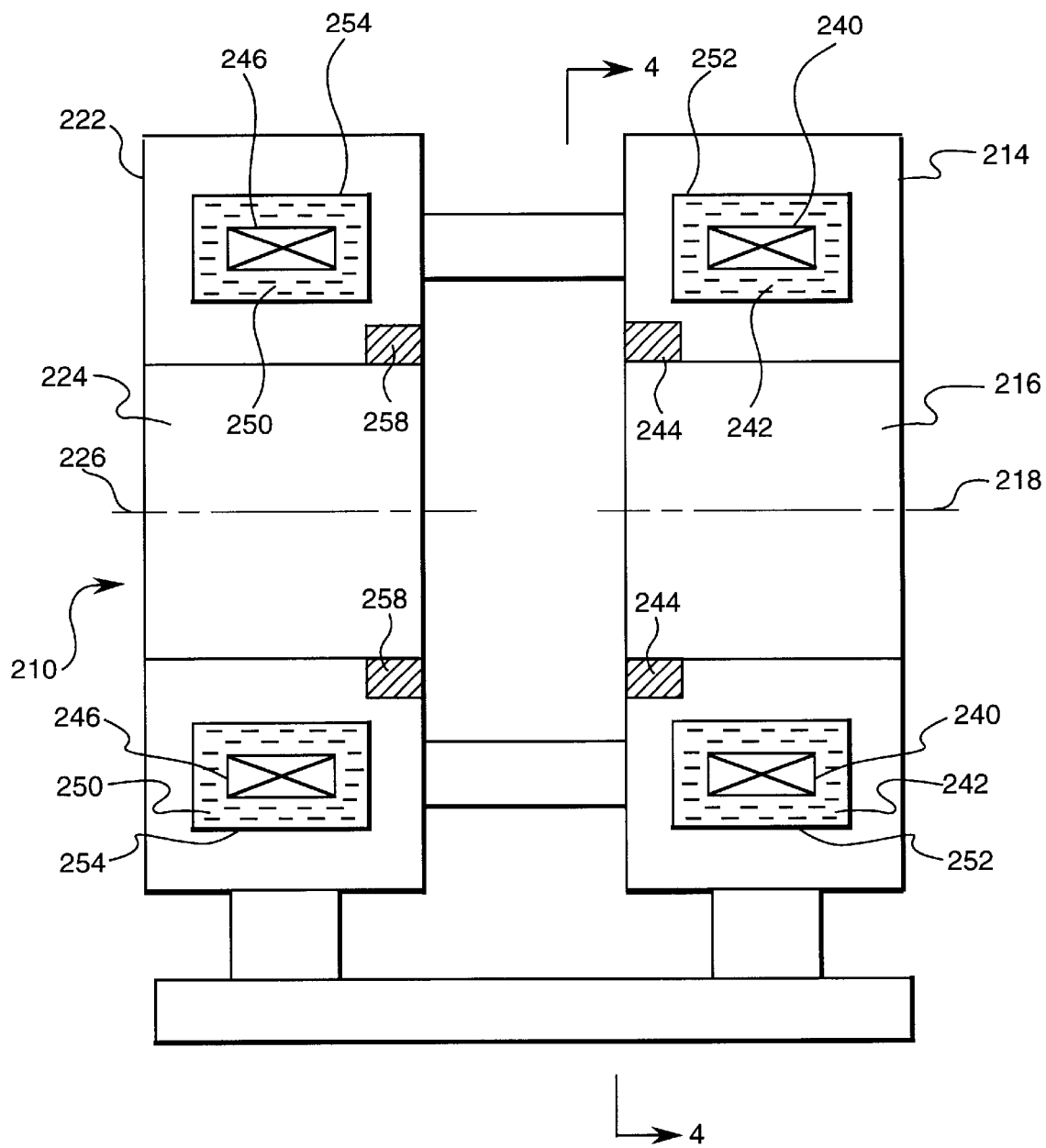
FIG. 3 is a view, as in FIG. 2, but of a second preferred embodiment of the open MRI magnet of the invention having external ferromagnetic rings.

Referring again to the drawings, FIGS. 3–4 show a second preferred embodiment of the open magnetic resonance imaging (MRI) magnet 210 of the present invention. Magnet 210 is identical to magnet 110 of the first preferred embodiment of the invention, with differences as hereinafter noted. The cryogenic fluid 250 containing the second superconductive main coil 246 is fluidly independent of the cryogenic fluid 242 containing the first superconductive main coil 240 (i.e., in the second preferred embodiment there is no dewar conduit fluidly interconnecting the two dewars 252 and 254). The first ferromagnetic ring 244 is disposed outside (and not within) the first coil housing 214 in the first bore 216, and the second ferromagnetic ring 258 is disposed outside (and not within) the second coil housing 222 in the second bore 224. Preferably, as shown in FIG. 3, the first ferromagnetic ring 244 is attached to the first coil housing 214, and the second ferromagnetic ring 258 is attached to the second coil housing 222. The first coil housing 214 has a generally longitudinal first axis 218, and the second coil housing 222 has a generally longitudinal second axis 226. The first superconductive main coil 240 is generally coaxially aligned with the first axis 218, and the second superconductive main coil 246 is generally coaxially aligned with the second axis 226. The longitudinal second axis 226 is generally coaxially aligned with the longitudinal first axis 218 which means that the longitudinal first and second axes are generally coincident. It is noted, as shown in FIG. 4, that the first ferromagnetic ring 244 comprises a circumferentially-continuous ring.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. An open magnetic resonance imaging magnet comprising:
    a) a first superconductive coil assembly including:
        (1) a toroidal-shaped first coil housing surrounding a first bore and having a longitudinal first axis; and
        (2) a generally annular-shaped first superconductive main coil coaxially aligned with said first axis, disposed within said first coil housing, and at least partially immersed in a cryogenic fluid;
    b) a generally-non-permanently-magnetized first ferromagnetic ring generally aligned with said first axis and spaced radially inward and radially apart from said first superconductive main coil;
    c) a second superconductive coil assembly including:
        (1) a generally toroidal-shaped second coil housing longitudinally spaced apart from said first coil housing, surrounding a second bore and having a longitudinal second axis coaxially aligned with said first axis; and
        (2) a annular-shaped second superconductive main coil coaxially aligned with said second axis, disposed within said second coil housing, and at least partially immersed in a cryogenic fluid; and
    d) a non-permanently-magnetized second ferromagnetic ring coaxially aligned with said second axis and spaced radially inward and radially apart from said second superconductive main coil, wherein said first and second ferromagnetic rings are spaced longitudinally inward and longitudinally apart from said first and second superconductive main coils, and wherein said first and second ferromagnetic rings are the only ferromagnetic rings of said magnet which are spaced radially and longitudinally inward and radially and longitudinally apart from said first and second superconductive main coils.

2. The magnet of claim 1, wherein said second superconductive coil assembly is a mirror image of said first superconductive coil assembly about a plane oriented perpendicular to said first axis and disposed longitudinally midway between said first and second coil housings, and wherein said second ferromagnetic ring is a mirror image of said first ferromagnetic ring about said plane.

3. The magnet of claim 2, wherein said first ferromagnetic ring comprises a circumferentially-continuous ring.

4. The magnet of claim 2, wherein said first ferromagnetic ring is disposed within said first coil housing and said second ferromagnetic ring is disposed within said second coil housing.

5. The magnet of claim 2, wherein said first ferromagnetic ring is disposed outside said first coil housing in said first bore and said second ferromagnetic ring is disposed outside said second coil housing in said second bore.

6. The magnet of claim 5, wherein said first ferromagnetic ring is attached to said first coil housing and said second ferromagnetic ring is attached to said second coil housing.

7. The magnet of claim 2, wherein said cryogenic fluid containing said second superconductive main coil is fluidly independent of said cryogenic fluid containing said first superconductive main coil.

8. The magnet of claim 2, wherein said cryogenic fluid containing said second superconductive main coil is in fluid communication with said cryogenic fluid containing said first superconductive main coil.

9. The magnet of claim 2, wherein said cryogenic fluid containing said first superconductive main coil and said cryogenic fluid containing said second superconductive main coil each consist essentially of liquid helium.

* * * * *